April 24, 1962 E. B. MOORE ET AL 3,031,624

TRANSISTOR DETECTOR

Filed Oct. 20, 1959

INVENTORS
EDWARD B. MOORE
THOMAS F. HOUGHTON

BY
Mead, Browne, Schuyler & Beveridge
ATTORNEYS

United States Patent Office 3,031,624
Patented Apr. 24, 1962

3,031,624
TRANSISTOR DETECTOR

Edward B. Moore, North Caldwell, and Thomas F. Houghton, Franklin Lakes, N.J., assignors to Aircraft Radio Corporation, Boonton, N.J., a corporation of New Jersey Filed Oct. 20, 1959, Ser. No. 847,492
13 Claims. (Cl. 329—101)

Figure 1:
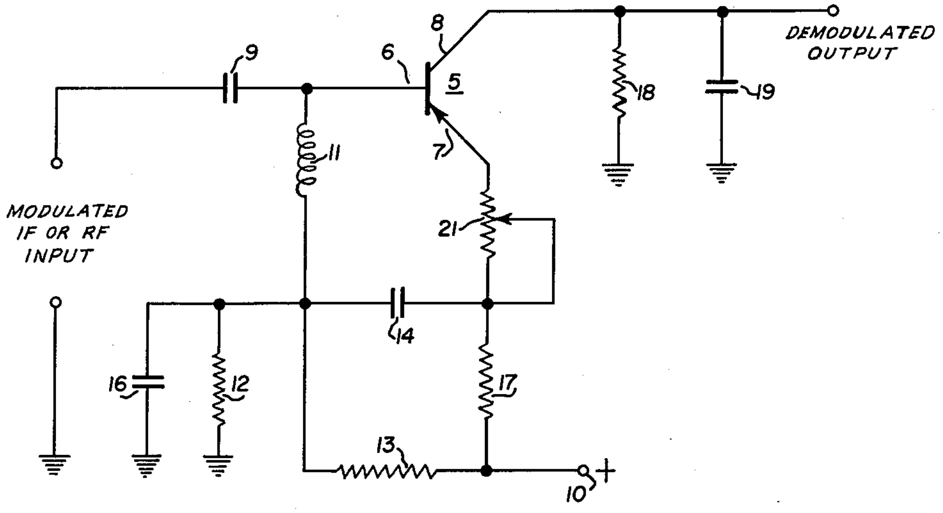

This invention relates to a detector circuit for an amplitude modulated signal, and more particularly to a transistor detector circuit.

The present invention is in the nature of an improvement over prior transistor detectors, as for example, the transistor detector disclosed in Hunter's "Handbook of Semi-Conductor Electronics" at pages 12–29, 30 and the transistor detector disclosed in Straube Patent No. 2,864,-022, in that detection is achieved in the base-emitter diode circuit of the transistor, while these prior devices depend on detection in the base-collector circuit of the transistor. In this respect, the prior transistor detectors are quite similar to the well-known vacuum tube plate detector in that the transistor is biased to operate in a condition near the point of collector current cut-off to achieve the non-linearity necessary for detection. Since the direct current output of such detectors increases as the signal strength increases, these detectors do not lend themselves to direct coupling to subsequent stages. Moreover, the sensitivity of these detectors is quite low and distortion is relatively high.

An object of this invention is to provide a transistor detector which may be directly coupled to following stages and in which the average direct current output of the detector is substantially independent of variations in the strength of the carrier.

Another object of this invention is to provide a circuit which accomplishes detection and power amplification in a single transistor.

According to the invention, detection is accomplished in a forwardly biased diode circuit of the transistor. The transistor base-emitter diode is connected in a series circuit which includes a capacitor affording a low impedance to the modulation frequency, and an inductance which presents a high impedance to the carrier frequency and a low impedance to the modulation frequency. A second capacitor connected at the junction of the coil and capacitor provides a low impedance by-passing path to the carrier frequency. A voltage divider applies a forward biasing potential to the base-emitter diode of the transistor while a resistor in the emitter circuit provides stabilization of the transistor for direct currents.

A by-pass capacitor may be connected to the output electrode of the transistor along with a load resistor. A gain control resistor may be connected in series with the emitter electrode of the transistor.

In operation, a modulated carrier signal is applied in series with a coupling capacitor across the inductance in the base-emitter circuit of the transistor. Currents of modulation frequency, resulting from non-linearity of the base-emitter diode characteristic, flow freely through the large capacitor in the base-emitter diode circuit. These currents are amplified in the collector-base diode by normal transistor action and transfer power to the load. Direct currents developed in the base-emitter diode flow through the emitter resistor. As the resulting voltage drops across the resistance is degenerative, direct current components are largely suppressed. Consequently, no large changes in the average direct current at the collector can occur.

Figure 2:
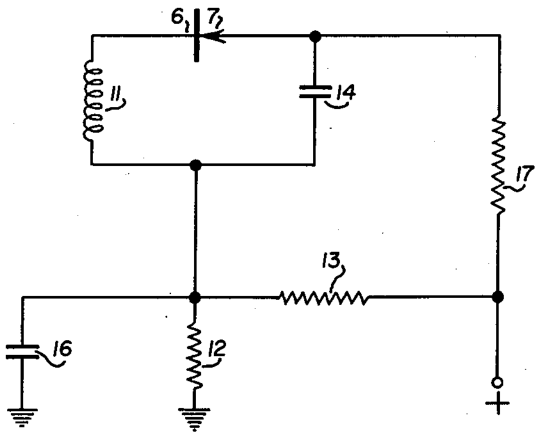

Other objects, advantages and features of this invention will become apparent from the following specification and accompanying drawings wherein:

FIG. 1 is a schematic diagram of a transistor detector embodying the invention; and FIG. 2 is a simplified schematic diagram showing two of the transistor electrodes connected in a rectifier circuit to facilitate the explanation and understanding of the invention.

Referring now to the drawings, a transistor 5, having base 6, emitter 7 and collector 8 electrodes, is forwardly biased from a source of potential 10 by a voltage divider, comprising resistors 12 and 13 connected to the base 6 of the transistor 5 through inductance 11. Resistor 17 is connected to the emitter and serves as the emitter D.C. load in order that transistor D.C. stability may be obtained. Since the emitter and base are forwardly biased, current flows in the emitter and base circuit to place the transistor operating condition at a level corresponding to thta of a class A amplifier.

Referring to FIG. 2, it will be observed that base electrode 6 and emitter electrode 7 form a diode which is connected in series with a capacitor 14 and a circuit component in the form of inductance 11. Capacitor 14 is selected to present a low impedance to the modulation frequency and inductance 11 is selected to present a high impedance to the carrier frequency and a low impedance to the modulation frequency. In addition, capacitor 14 blocks the flow of any average D.C. in the emitter-base diode circuit due to the input signal.

At the juncture of capacitor 14 and inductance 11, a capacitor 16 provides a by-pass, or low impedance path to the carrier frequencies. A resistor 18 by-passed at the carrier frequency by capacitor 19 serves as the collector load resistor across which is developed the modulation frequency.

A modulated carrier signal is coupled to the detector circuit by a coupling capacitor 9 and is developed across inductance 11. As will be observed from the simplified schematic diagram shown in FIG. 2, this modulated carrier is rectified and de-modulated by the action of the emitter-base diode of the transistor, which as hereinbefore noted, is forwardly based. Capacitor 14 allows the modulation frequency to pass along with the carrier frequency which may be present in the signal. However, inductance 11 is a high impedance at the carrier frequency so the carrier frequency is prevented from flowing in this series circuit. Capacitor 16 is a by-pass for the carrier signal. Inductance 11 while being a high impedance to the carrier frequency, is a lower impedance to the modulation frequency so that the modulation frequency is applied to the base electrode 6 of the transistor. Due to transistor action, the modulation frequency is amplified and developed across resistor 18. Capacitor 19 is a by-pass at the carrier frequency to eliminate carrier frequency currents in the load.

An adjustable resistor 21 may be connected in the emitter circuit to adjust the gain of the transistor.

Due to the effect of capacitor 14 and the forward biasing of the transistor, the direct current component of output collector current is substantially constant and relatively independent of carrier level.

The detector circuit thus described allows direct coupling to the following stages of amplification since the direct current component of the output is relatively free from variations in signal strength. The detector circuit may be designed to have good direct current stability with temperature variations because the voltage divider comprising resistors 12 and 13 may be made low compared to the emitter load resistor 17. Also, due to the fact that the transistor is forwardly biased, a relatively large emitter voltage (as compared to the base to emitter voltage) may be employed. Thus, variations in the base to emitter voltage will have only a secondary effect on the operating point of the transistor.

In addition, the following stages of amplification may be designed for good direct current stability since they may be direct coupled to the direct current stabilized detector. The desired low base return resistance and the high alternating current impedance are then obtained at the carrier frequency where the required inductance is low rather than at the low modulation frequency where the required inductance is rather high.

While we have shown and described but one embodiment of our invention it will be obvious to those skilled in the art that many modifications and changes may be made in the circuit illustrated in the drawing without departing from the scope of the invention.

We claim:

1. A detector for an amplitude modulated carrier comprising a transistor, means for applying forward biasing potentials to the electrodes of the transistor, an input circuit including a component in a series circuit with a first capacitor and the emitter and base electrodes of the transistor, said first capacitor having a low impedance at the carrier frequency, said component having a relatively high impedance at the carrier frequency and a relatively low impedance at the modulation frequency, input means for supplying an amplitude modulated carrier to said series circuit across said component, a second capacitor connected to the junction of said first capacitor and said component for by-passing the carrier frequency, and an output circuit connected to the collector and the emitter electrodes of said transistor for developing an output current varying according to the modulation of the carrier whose average direct current value is relatively independent of carrier signal level.

2. A detector circuit as defined in claim 1 wherein said component is an inductance.

3. A detector for an amplitude modulated carrier comprising a transistor having an input electrode, an output electrode, and a third electrode forming a diode with said input electrode, means for applying forward biasing potentials to the electrodes of said transistor, a series circuit including said input electrode and said third electrode, a first capacitor having a low impedance to the modulation frequency, an impedance element connected between said input electrode and one end of said first capacitor presenting a low impedance path to said modulation frequency and a high impedance path to the carrier frequency and means connecting the other end of said first capacitor to said third electrode, a second capacitor connected to the juncture of said impedance element and said first capacitor affording a low impedance path to the carrier frequency, and an output circuit connected to the output electrode of said transistor for developing an output current varying according to the modulation of the carrier whose average direct current value is relatively independent of carrier signal level.

4. A detector circuit as defined in claim 3 wherein said impedance element is an inductance.

5. A detector for an amplitude modulated carrier signal comprising a transistor having an input electrode, and an output electrode and a third electrode forming a diode with said input electrode, means for applying forward biasing potentials to said input electrode and said third electrode, a series circuit, including, said input electrode, said third electrode, and a capacitor, said series circuit having a low impedance to the modulation frequency, and a high impedance to the carrier frequency, an input circuit for supplying an amplitude modulated carrier signal to said input electrode, and an output circuit connected to the output electrode of said transistor for developing an output current varying according to the modulation of the carrier whose average direct current value is relatively independent of carrier signal level.

6. A detector for an amplitude modulated carrier comprising a transistor having an input electrode, and an output electrode and a third electrode forming a diode with said input electrode, means for applying forward biasing potentials to said input electrode and said third electrode, a series circuit including said input electrode, said third electrode and a capacitor, said series circuit having a low impedance to the modulation frequency and a high impedance to the carrier frequency, an input circuit for supplying an amplitude modulated carrier signal to said series circuit, a second capacitor connected to said series circuit for by-passing the carrier frequency, and an output circuit connected to the output electrode of said transistor for developing an output current varying according to the modulation of the carrier and having an average direct current value which is relatively independent of carrier signal level.

7. A detector for an amplitude modulated carrier signal comprising a transistor having an input electrode, an output electrode and a third electrode forming a diode with said input electrode, means for applying forward biasing potentials to said input electrode and said third electrode, a series circuit including said input electrode, said third electrode, a capacitor having a low impedance to the modulation frequency, and an inductance having a high impedance to the carrier frequency and a low impedance to the modulation frequency, an input circuit for supplying an amplitude modulated carrier signal to said series circuit across said inductance, and an output circuit connected to the output electrode of said transistor for developing an output current varying according to the modulation of the carrier whose average direct current value is relatively independent of the carrier signal level.

8. A detector for an amplitude modulated carrier signal comprising a transistor having an input electrode, an output electrode and a third electrode forming a diode with said input electrode, means for applying forward biasing potentials to said input electrode and said third electrode, a series circuit including said input electrode, said third electrode, a capacitor having a low impedance to the modulation frequency connected at one end to said third electrode and an inductance connected to the other end of said capacitor and to said input electrode, said inductance having a low impedance to the modulation frequency and a high impedance to the carrier frequency, an input circuit for supplying an amplitude modulated carrier signal to said input electrode, and an output circuit connected to the output electrode of said transistor for developing an output current varying according to the modulation of the carrier whose average direct current value is relatively independent of the carrier signal level.

9. A detector for an amplitude modulated carrier comprising a transistor, means for applying forward biasing potentials to electrodes of the transistor, an input circuit including a component in a series circuit with a first capacitor and the emitter and base electrodes of the transistor, said first capacitor having a low impedance at the carrier frequency, said component having a relatively high impedance at the carrier frequency and a relatively low impedance at the modulation frequency, input means for applying an amplitude modulated carrier across said component, a second capacitor connected to the junction of said first capacitor and component for by-passing the carrier frequency, means connected to said emitter electrode for suppressing the direct current component of a detected signal, and an output circuit connected to the collector and the emitter electrodes of said transistor for developing an output current varying according to the modulation of the carrier whose average direct current value is relatively independent of carrier signal level.

10. A detector for amplitude modulated carrier comprising a transistor having an input electrode, an output electrode and a third electrode forming a diode with said input electrode, means for applying forward biasing potentials to the electrodes of said transistor, a series circuit including said input electrode and said third electrode, a first capacitor having a low impedance to the modulation frequency, an impedance element connected between said input electrode and one end of said first capacitor presenting a low impedance to said modulation frequency and a high impedance path to the carrier frequency and means connecting the other end of said capacitor to said third electrode, a second capacitor connected to the juncture of said impedance element and said first capacitor affording a low impedance path to the carrier frequency, means connected to said third electrode for applying a degenerative direct current potential thereto so that the direct current components of a detected signal are suppressed, and an output circuit connected to the output electrode of said transistor for developing an output current varying according to the modulation of the carrier whose average direct current value is relatively independent of carrier signal level.

11. A detector for an amplitude modulated carrier signal comprising a transistor having an input electrode, an output electrode and a third electrode forming a diode with said input electrode, means for applying forward biasing potentials to said input electrode and said third electrode, a series circuit including a capacitor having a low impedance to the modulation frequency connected at one end to said third electrode and an inductance connected to the other end of said capacitor and to said input electrode, said inductance having a low impedance to the modulation frequency and a high impedance to the carrier frequency, an input circuit for applying an amplitude modulated carrier signal across said inductance, a resistor connected in circuit with said third electrode through which the direct current components of a detected signal flow to develop a degenerative potential at said third electrode, and an output circuit connected to the output electrode of said transistor for developing an output current varying according to the modulation of the carrier whose average direct current value is relatively independent of the carrier signal level.

12. A detector for an amplitude modulated carrier signal as defined in claim 11 wherein said resistor connected in circuit with said third electrode is a volume control resistor.

13. A detector for an amplitude modulated carrier signal as defined in claim 10 wherein said means connecting the other end of said capacitor to said third electrode is an adjustable resistor for adjusting the gain of said transistor.

References Cited in the file of this patent

UNITED STATES PATENTS

| | | |
|---|---|---|
| 2,802,071 | Lin | Aug. 6, 1957 |
| 2,866,892 | Barton | Dec. 30, 1958 |
| 2,891,146 | Sciurba | June 16, 1959 |